United States Patent
Luo

(10) Patent No.: US 9,318,635 B2
(45) Date of Patent: Apr. 19, 2016

(54) AUTOMATIC SOLAR TRACKING ADJUSTMENT/CONTROL APPARATUS OF SOLAR GENERATION SYSTEM

(71) Applicant: TOPPER SUN ENERGY TECHNOLOGY CO., LTD., Hsinchu County (TW)

(72) Inventor: Chia Ching Luo, Hsinchu County (TW)

(73) Assignees: Big Sun Energy Technology Incorporation, Hsinchu County (TW); Chia Ching Luo, Hsinchu County (TW)

( * ) Notice: Subject to any disclaimer, the term of this patent is extended or adjusted under 35 U.S.C. 154(b) by 423 days.

(21) Appl. No.: 13/762,697

(22) Filed: Feb. 8, 2013

(65) Prior Publication Data

US 2013/0276862 A1    Oct. 24, 2013

(30) Foreign Application Priority Data

Apr. 23, 2012  (TW) .............................. 101114440 A

(51) Int. Cl.
| | |
|---|---|
| F24J 2/38 | (2014.01) |
| F24J 2/52 | (2006.01) |
| F24J 2/54 | (2006.01) |
| H02S 20/30 | (2014.01) |
| H01L 31/052 | (2014.01) |
| H01L 31/042 | (2014.01) |

(52) U.S. Cl.
CPC ............. *H01L 31/052* (2013.01); *F24J 2/38* (2013.01); *F24J 2/5233* (2013.01); *F24J 2/5417* (2013.01); *H02S 20/00* (2013.01); *F24J 2002/5458* (2013.01); *F24J 2002/5482* (2013.01); *Y02E 10/47* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 2009/0107542 A1* | 4/2009 | Bender ......................... | 136/246 |
| 2010/0059043 A1* | 3/2010 | Hong et al. ................... | 126/573 |
| 2010/0147286 A1* | 6/2010 | Xiang et al. .................. | 126/600 |
| 2013/0000693 A1* | 1/2013 | Waterhouse et al. .......... | 136/246 |

* cited by examiner

*Primary Examiner* — Susan D Leong
(74) *Attorney, Agent, or Firm* — Rosenberg, Klein & Lee

(57) ABSTRACT

An automatic solar tracking adjustment/control apparatus of solar generation system includes a support assembly, a two-dimensionally movable pivotal rotational assembly disposed on the support assembly, a solar generation module disposed on the support assembly via the pivotal rotational assembly and at least one drive assembly disposed between the support assembly and the solar generation module. The drive assembly drives the solar generation module to tilt in different directions and angles according to reference parameters in a control unit. A detection/correction module is disposed on the solar generation module for detecting actual parameters of the solar generation module. The control unit compares the actual parameters with the reference parameters to modify the output of the drive assembly so as to adjust the tilting direction and inclination angle of the solar generation module.

36 Claims, 4 Drawing Sheets

AUTOMATIC SOLAR TRACKING ADJUSTMENT/CONTROL APPARATUS OF SOLAR GENERATION SYSTEM

BACKGROUND OF THE INVENTION

1. Field of the Invention

The present invention relates generally to an automatic solar tracking adjustment/control apparatus of solar generation system, and more particularly to a solar tracking adjustment/control apparatus, which can drive the solar generation module and detect the tilting state of the solar generation module so as to automatically precisely adjust the tilting direction and inclination angle of the solar generation module in accordance with preset parameters. Accordingly, the solar generation module can always face the sun to achieve best power generation efficiency.

2. Description of the Related Art

A conventional simple-type solar generation apparatus (solar panel) is generally disposed in a fixed position and tilted at a fixed inclination angle for receiving sunshine. Such simple-type solar generation apparatus has a simplified structure and is easy to install so that the installation cost and the successive maintenance fee are lower. However, in practice, the position of the sun changes with time. Therefore, the solar generation apparatus (solar panel) disposed in the fixed position and tilted at the fixed inclination angle cannot always face the sun, that is, the projection direction of the sunshine can be hardly kept normal to the solar panel. Accordingly, it is hard for the solar generation apparatus (solar panel) to have an optimal sunshine effect. As a result, the power generation efficiency of such solar generation apparatus is poor.

To solve the above problem, an improved solar generation apparatus (solar panel) adjustable in inclination angle has been disclosed and applied in this field. In such solar generation apparatus, the solar panel is disposed on a secure support via a pivotal rotational joint. A drive mechanism is used to drive the solar panel to pivotally rotate relative to the support. Accordingly, the solar panel can be tilted by different inclination angles with the change of the position of the sun according to preset parameters. Therefore, the direction of the sunshine can be kept normal to the solar panel so that the power generation efficiency is enhanced. However, the drive mechanism of the above solar panel is generally driven by a motor as a power source. The motor outputs power and transmits the power to the drive mechanism via a chain or a belt. During the rotation of the solar panel, the chain or belt will inevitably slightly slip to cause error in precision. As a result, the solar panel can be hardly pivotally rotated and tilted in an expected direction and inclination angle. Therefore, it is tried by the applicant to provide an automatic solar tracking adjustment/control apparatus of solar generation system, which can always automatically detect the tilting direction and inclination angle of the solar panel and compare these parameters with the preset reference parameters to adjust the tilting direction and inclination angle of the solar panel. Therefore, the solar panel can be precisely pivotally rotated and tilted in accordance with the preset reference parameters. Accordingly, the solar panel can have an optimal sunshine effect to achieve best power generation efficiency.

SUMMARY OF THE INVENTION

It is therefore a primary object of the present invention to provide an automatic solar tracking adjustment/control apparatus of solar generation system. The solar tracking adjustment/control apparatus includes an accelerometer for detecting the tilting direction and inclination angle of the solar generation module to generate correction information so as to control the pivotal rotation of the solar generation module. Accordingly, the solar generation module can be always precisely tilted in a correct direction and angle in accordance with the preset solar tracking parameters.

To achieve the above and other objects, the automatic solar tracking adjustment/control apparatus of solar generation system of the present invention includes: a support assembly, a support seat being disposed at one end of the support assembly; a carrier platform disposed on the support seat via a two-dimensionally movable pivotal rotational assembly, at least one solar generation module being disposed on the carrier platform for converting solar energy into electrical energy; at least one drive assembly disposed between the support assembly and the carrier platform, the drive assembly serving to drive the carrier platform according to reference parameters previously stored in a control unit, whereby the carrier platform can be tilted in different directions and different inclination angles around the pivotal rotational assembly; and a detection/correction module disposed on the carrier platform for detecting and obtaining actual parameters including tilting direction and inclination angle of the carrier platform and feeding the actual parameters back to the control unit, the control unit comparing the actual parameters with the previously stored reference parameters to obtain a comparison result, whereby according to the comparison result, the control unit modifies the tilting direction and inclination angle of the carrier platform via the drive assembly.

In the above automatic solar tracking adjustment/control apparatus, the detection/correction module at least includes an accelerometer.

In the above automatic solar tracking adjustment/control apparatus, the control unit is disposed in the detection/correction module.

In the above automatic solar tracking adjustment/control apparatus, the support assembly at least has a support column. The support seat is disposed at one end of the support column.

In the above automatic solar tracking adjustment/control apparatus, two drive assemblies are disposed between the support assembly and the carrier platform. Each drive assembly includes a power source and a connection member drivable by the power source. The connection member is a flexible body connected to two opposite sections of the carrier platform.

In the above automatic solar tracking adjustment/control apparatus, the power source is connected to the connection member via a drive member.

In the above automatic solar tracking adjustment/control apparatus, the power source is a motor and the connection member is a steel cable and the drive member is a drive wheel connected to the steel cable.

In the above automatic solar tracking adjustment/control apparatus, each drive assembly further includes at least one idling member and the connection member passes through an edge of the idling member and is reversely wound.

In the above automatic solar tracking adjustment/control apparatus, each connection member is serially connected with at least one elastic member.

In the above automatic solar tracking adjustment/control apparatus, the carrier platform is polygonal and two ends of the connection member are respectively connected to two opposite corners of the carrier platform.

In the above automatic solar tracking adjustment/control apparatus, the pivotal rotational assembly includes a pivot seat, a first shaft rod and a second shaft rod. The first and second shaft rods pass through the pivot seat and intersect each other. Two ends of the first shaft rod are disposed on the support seat, while two ends of the second shaft rod are disposed on the carrier platform.

In the above automatic solar tracking adjustment/control apparatus, the two ends of the first shaft rod are pivotally connected to the support seat via bearings and the two ends of the second shaft rod are connected to the carrier platform via bearings.

The present invention can be best understood through the following description and accompanying drawings, wherein:

DETAILED DESCRIPTION OF THE PREFERRED EMBODIMENTS

Figure 1:
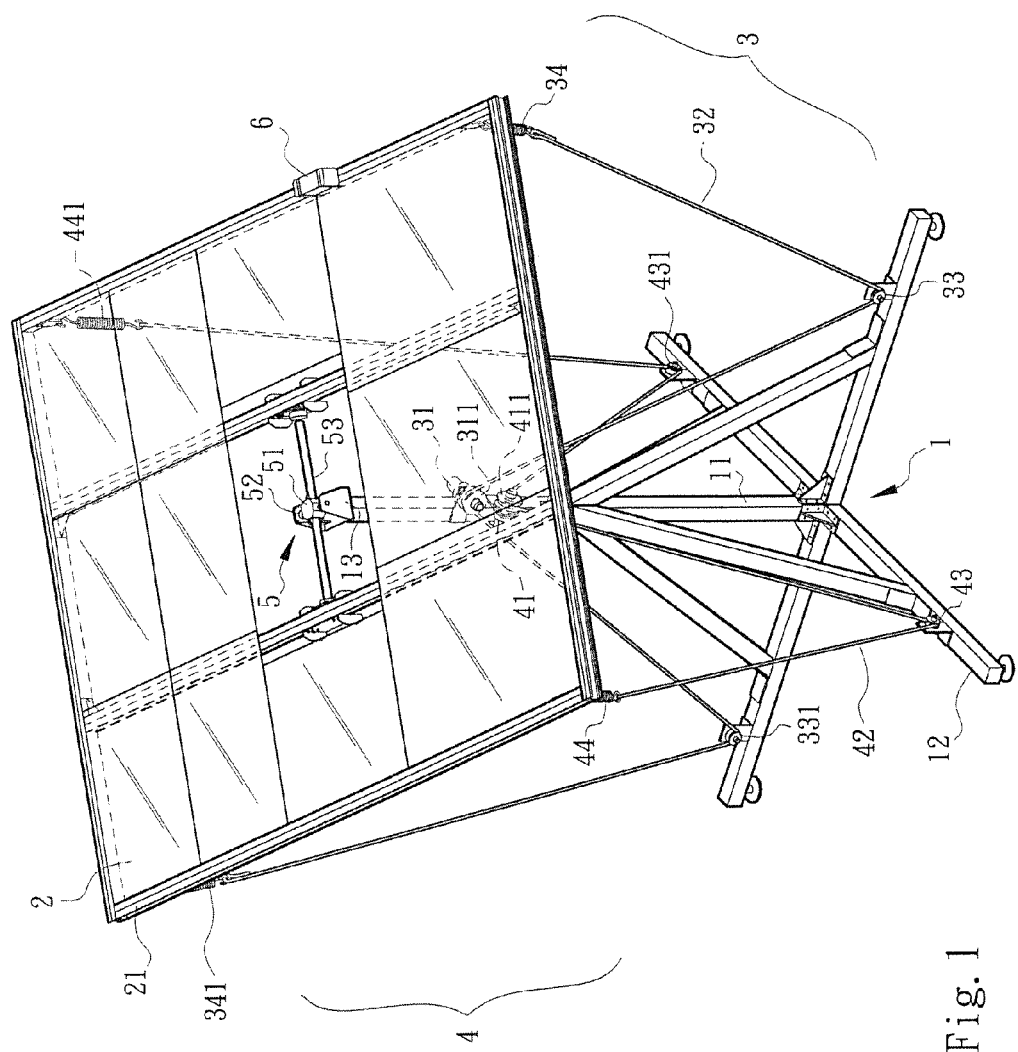
FIG. 1 is a perspective view of the present invention.
Figure 2:
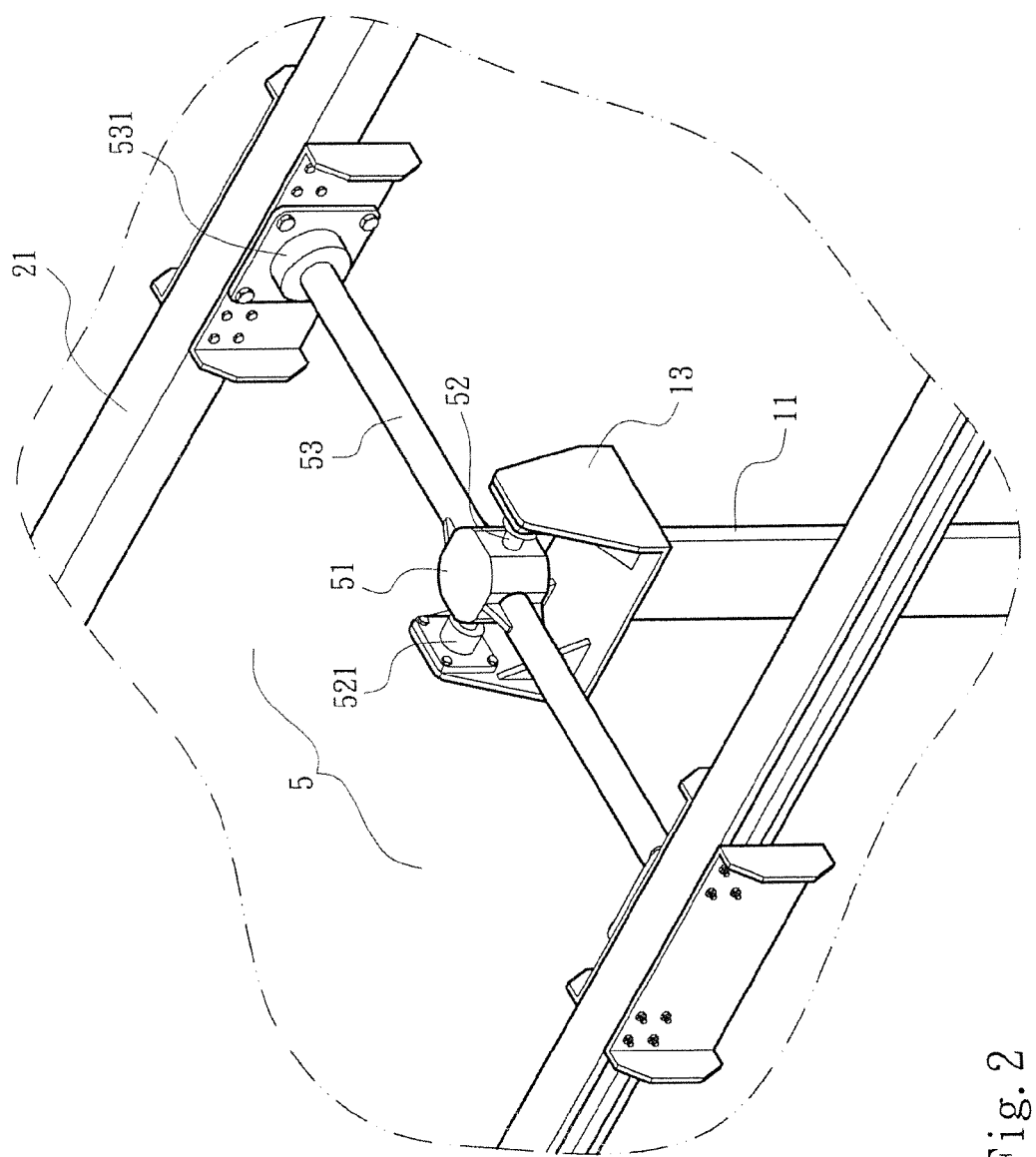
FIG. 2 is an enlarged view of the pivot seat and the relevant sections of the present invention.

Please refer to FIGS. 1 and 2. The automatic solar tracking adjustment/control apparatus of the solar generation system of the present invention includes a support assembly 1, a solar generation module 2, at least one drive assembly (a first drive assembly 3 and a second drive assembly 4 as shown in FIG. 1) for driving the solar generation module 2, a pivotal rotational assembly 5 and a detection/correction module 6. The support assembly 1 has a support column 11 and a base seat 12 outward extending from one end of the support column 11 for securely supporting the solar generation module 2 on the ground or a preset plane face. A support seat 13 is disposed at the other end of the support column 11, which end is distal from the base seat 12. A middle section of the support seat 13 is recessed.

The pivotal rotational assembly 5 is composed of a pivot seat 51, a first shaft rod 52 and a second shaft rod 53. The first and second shaft rods 52, 53 pass through the pivot seat 51 and intersect each other. The first shaft rod 52 is fixed on the pivot seat 51. Two ends of the first shaft rod 52 are pivotally disposed on the support seat 13 via two bearings 521. (In practice, alternatively, the two ends of the first shaft rod 52 can be fixed on the support seat 13 and the pivot seat 51 is pivotally connected on the middle section of the first shaft rod 52). Accordingly, the pivot seat 51 can be one-dimensionally pivotally rotated around the first shaft rod 52 relative to the support seat 13. The second shaft rod 53 is also fixed on the pivot seat 51. Two ends of the second shaft rod 53 are pivotally disposed on a carrier platform 21 via two bearings 531. (In practice, alternatively, the two ends of the second shaft rod 53 can be fixed on the carrier platform 21 and the pivot seat 51 is pivotally connected on the middle section of the second shaft rod 53). Accordingly, the carrier platform 21 can be two-dimensionally pivotally rotated around the second shaft rod 53 relative to the support seat 13.

The solar generation module 2 is disposed on the carrier platform 21 for receiving solar energy to generate electrical power.

The first drive assembly 3 and the second drive assembly 4 are disposed between the support assembly 1 and the carrier platform 21. In this embodiment, the first drive assembly 3 at least includes a power source 31, (which can be a motor) and a connection member 32, (which can be a steel cable). The power source 31 (motor) is drivingly connected to the connection member 32 (steel cable) via a drive member 311, (which can be a drive wheel). Two ends of the connection member 32 (steel cable) are connected to two opposite sections of the carrier platform 21. In this embodiment, the carrier platform 21 is polygonal (quadrangular) and the power source 31 is disposed at the middle of the support column 11. In addition, two idling members 33, 331, (which can be idlers) are disposed on the base seat 12 of the support assembly 1. The connection member 32 (steel cable) passes through the two idling members 33, 331 and is wound in the form of W. Furthermore, two ends of the connection member 32 (steel cable) are respectively serially connected to two elastic members 34, 341 and then connected to two opposite corners of the carrier platform 21.

The second drive assembly 4 at least includes a power source 41, (which can be a motor) and a connection member 42, (which can be a steel cable). The power source 41 (motor) is drivingly connected to the connection member 42 (steel cable) via a drive member 411, (which can be a drive wheel). Two ends of the connection member 42 (steel cable) are connected to two other opposite sections of the carrier platform 21. In this embodiment, the carrier platform 21 is polygonal (quadrangular) and the power source 41 is disposed at the middle of the support column 11. In addition, two idling members 43, 431, (which can be idlers) are disposed on the base seat 12 of the support assembly 1. The connection member 42 (steel cable) passes through the two idling members 43, 431 and is wound in the form of W. Furthermore, two ends of the connection member 42 (steel cable) are respectively serially connected to two elastic members 44, 441 and then connected to two other opposite corners of the carrier platform 21.

The detection/correction module 6 is disposed on the carrier platform 21. The detection/correction module 6 at least has an accelerometer and a control unit inside the detection/correction module 6. The accelerometer serves to detect various actual parameters including position, direction and inclination angle and transmit the actual parameters to the control unit. The control unit stores various preset reference parameters for comparing the actual parameters with the reference parameters. According to the comparison result, the control unit can modify the output of the power sources 31, 41.

In the above structure, in practice, the control unit can be alternatively disposed outside the detection/correction module 6, (for example, on the base seat 12 of the support assembly 1). In addition, the control unit can be received in a container as necessary.

Figure 3:
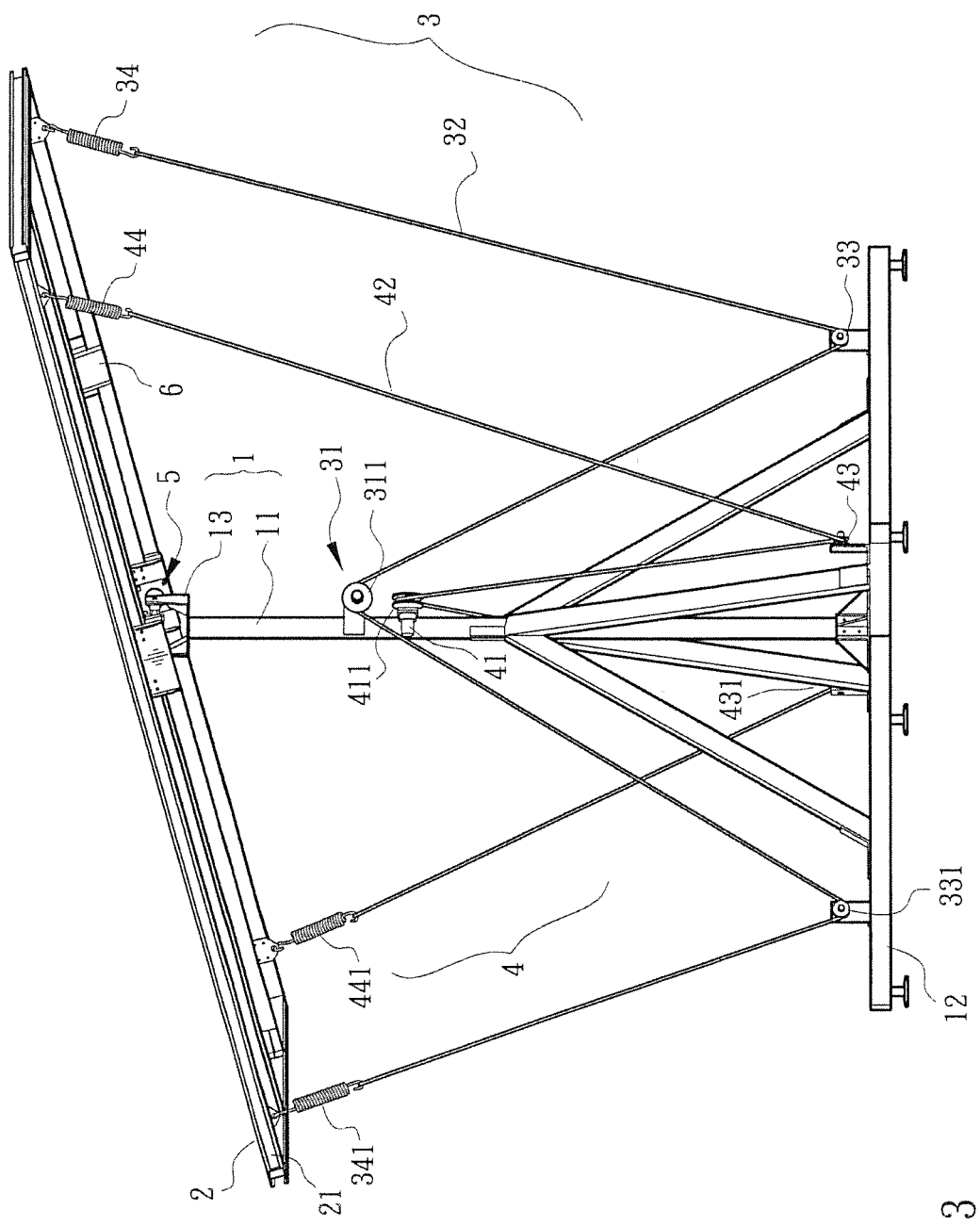
FIG. 3 is a perspective view showing the operation of the present invention in one state.
Figure 4:
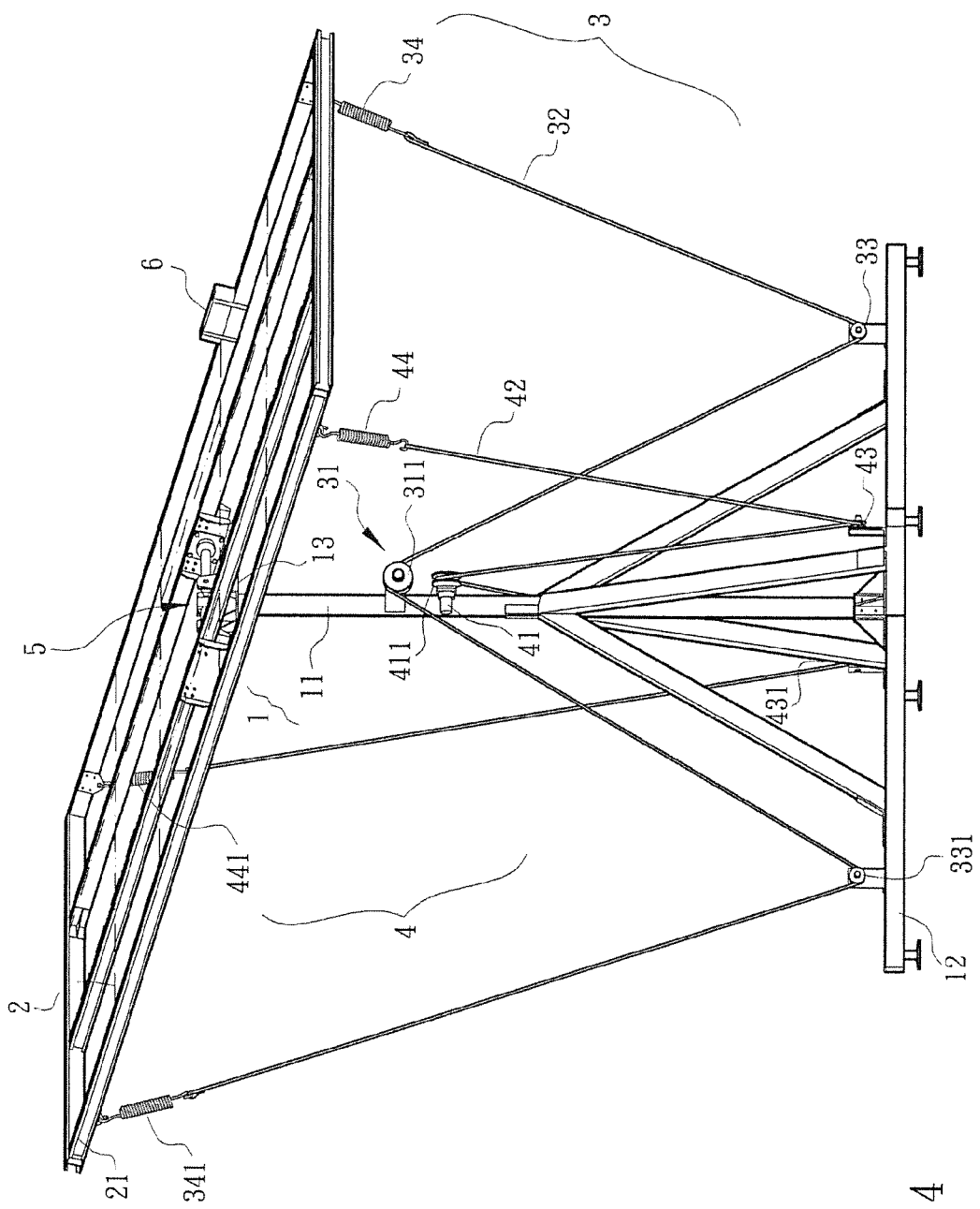
FIG. 4 is a perspective view showing the operation of the present invention in another state.

Please refer to FIGS. 3 and 4. In operation, according to the various parameters stored in the control unit of the detection/correction module 6, the control unit drives the power sources 31, 41 (motors) of the first and second drive assemblies 3, 4 to operate. At this time, via the drive members 311, 411 (drive wheels), the power sources 31, 41 (motors) drive the connection members 32, 42 (steel cables) so as to drive the carrier platform 21 to pivotally rotate and tilt around the pivotal rotational assembly in a preset direction.

During the pivotal rotation and tilting of the carrier platform 21, the accelerometer in the detection/correction module 6 is synchronously tilted. At this time, the accelerometer can detect the various actual parameters of the carrier platform 21, including tilting direction and inclination angle and transmit the actual parameters to the control unit. The control unit compares the actual parameters with the preset reference parameters stored in the control unit. Then, according to the comparison result, the control unit modifies the output of the power sources 31, 41 so that the direction and inclination angle of the carrier platform 21 can conform to the set parameters stored in the control unit. Accordingly, the solar generation module 2 on the carrier platform 21 can be directed in a preset direction and tilted by a preset inclination angle to always face the sun so as to achieve an optimal sunshine effect and best power generation efficiency.

In conclusion, the automatic solar tracking adjustment/control apparatus of the solar generation system of the present invention can detect the tilting state of the solar generation module to automatically adjust the solar generation module to a correct inclination angle and correct direction according to the set parameters.

The above embodiments are only used to illustrate the present invention, not intended to limit the scope thereof. Many modifications of the above embodiments can be made without departing from the spirit of the present invention.

What is claimed is:

1. An automatic solar tracking adjustment/control apparatus of solar generation system, comprising:
a support assembly, a support seat being disposed at one end of the support assembly;
a carrier platform disposed on the support seat via a two-dimensionally movable pivotal rotational assembly, at least one solar generation module being disposed on the carrier platform for converting solar energy into electrical energy;
at least one drive assembly disposed between the support assembly and the carrier platform, the drive assembly driving the carrier platform according to reference parameters pre-stored in a control unit, the carrier platform being thereby correspondingly tilted in different directions and different inclination angles around the pivotal rotational assembly, the drive assembly including:
at least one connection member having opposed ends and an intermediate portion extending therebetween, the opposed ends being coupled to the carrier platform, the intermediate portion being coupled at a plurality of pivot points located on the support assembly; and
a power source coupled to the intermediate portion of the connection member; and
a detection/correction module disposed on the carrier platform for detecting and obtaining actual values for parameters including tilting direction and inclination angle of the carrier platform and feeding the actual parameters values back to the control unit, the control unit comparing the actual parameters values with the pre-stored reference parameters to obtain a comparison result, the control unit adjusting the tilting direction and inclination angle of the carrier platform via the drive assembly according to the comparison result.

2. The automatic solar tracking adjustment/control apparatus of solar generation system as claimed in claim 1, wherein the detection/correction module at least includes an accelerometer.

3. The automatic solar tracking adjustment/control apparatus of solar generation system as claimed in claim 2, wherein the control unit is disposed in the detection/correction module.

4. The automatic solar tracking adjustment/control apparatus of solar generation system as claimed in claim 1, wherein the support assembly at least has a support column, the support seat being disposed at one end of the support column.

5. The automatic solar tracking adjustment/control apparatus of solar generation system as claimed in claim 1, wherein two drive assemblies are disposed on the support assembly, the connection member of each drive assembly being a flexible body connected to two opposite sections of the carrier platform.

6. The automatic solar tracking adjustment/control apparatus of solar generation system as claimed in claim 2, wherein two drive assemblies are disposed on the support assembly, the connection member of each drive assembly being a flexible body connected to two opposite sections of the carrier platform.

7. The automatic solar tracking adjustment/control apparatus of solar generation system as claimed in claim 4, wherein two drive assemblies are disposed on the support assembly, the connection member of each drive assembly being a flexible body connected to two opposite sections of the carrier platform.

8. The automatic solar tracking adjustment/control apparatus of solar generation system as claimed in claim 5, wherein the power source is connected to the connection member via a drive member.

9. The automatic solar tracking adjustment/control apparatus of solar generation system as claimed in claim 6, wherein the power source is connected to the connection member via a drive member.

10. The automatic solar tracking adjustment/control apparatus of solar generation system as claimed in claim 7, wherein the power source is connected to the connection member via a drive member.

11. The automatic solar tracking adjustment/control apparatus of solar generation system as claimed in claim 8, wherein the power source is a motor and the connection member is a steel cable and the drive member is a drive wheel connected to the steel cable.

12. The automatic solar tracking adjustment/control apparatus of solar generation system as claimed in claim 9, wherein the power source is a motor and the connection member is a steel cable and the drive member is a drive wheel connected to the steel cable.

13. The automatic solar tracking adjustment/control apparatus of solar generation system as claimed in claim 5, wherein each drive assembly further includes at least one idling member, and the connection member passes reversibly about each idling member.

14. The automatic solar tracking adjustment/control apparatus of solar generation system as claimed in claim 6, wherein each drive assembly further includes at least one idling member, and the connection member passes reversibly about each idling member.

15. The automatic solar tracking adjustment/control apparatus of solar generation system as claimed in claim 7, wherein each drive assembly further includes at least one idling member, and the connection member passes reversibly about each idling member.

16. The automatic solar tracking adjustment/control apparatus of solar generation system as claimed in claim 5, wherein the ends of each connection member is serially connected with at least one elastic member.

17. The automatic solar tracking adjustment/control apparatus of solar generation system as claimed in claim 6, wherein the ends of each connection member is serially connected with at least one elastic member.

18. The automatic solar tracking adjustment/control apparatus of solar generation system as claimed in claim 7, wherein the ends of each connection member is serially connected with at least one elastic member.

19. The automatic solar tracking adjustment/control apparatus of solar generation system as claimed in claim 16, wherein the elastic member is disposed at a section of the carrier platform, which section is connected to the connection member.

20. The automatic solar tracking adjustment/control apparatus of solar generation system as claimed in claim 17, wherein the elastic member is disposed at a section of the carrier platform, which section is connected to the connection member.

21. The automatic solar tracking adjustment/control apparatus of solar generation system as claimed in claim 18, wherein the elastic member is disposed at a section of the carrier platform, which section is connected to the connection member.

22. The automatic solar tracking adjustment/control apparatus of solar generation system as claimed in claim 5, wherein the carrier platform is polygonal and two ends of the connection member are respectively connected to two opposite corners of the carrier platform.

23. The automatic solar tracking adjustment/control apparatus of solar generation system as claimed in claim 6, wherein the carrier platform is polygonal and two ends of the connection member are respectively connected to two opposite corners of the carrier platform.

24. The automatic solar tracking adjustment/control apparatus of solar generation system as claimed in claim 7, wherein the carrier platform is polygonal and two ends of the connection member are respectively connected to two opposite corners of the carrier platform.

25. The automatic solar tracking adjustment/control apparatus of solar generation system as claimed in claim 1, wherein the pivotal rotational assembly includes a pivot seat, a first shaft rod and a second shaft rod, the first and second shaft rods passing through the pivot seat and intersecting each other, two ends of the first shaft rod being disposed on the support seat, while two ends of the second shaft rod being disposed on the carrier platform.

26. The automatic solar tracking adjustment/control apparatus of solar generation system as claimed in claim 2, wherein the pivotal rotational assembly includes a pivot seat, a first shaft rod and a second shaft rod, the first and second shaft rods passing through the pivot seat and intersecting each other, two ends of the first shaft rod being disposed on the support seat, while two ends of the second shaft rod being disposed on the carrier platform.

27. The automatic solar tracking adjustment/control apparatus of solar generation system as claimed in claim 4, wherein the pivotal rotational assembly includes a pivot seat, a first shaft rod and a second shaft rod, the first and second shaft rods passing through the pivot seat and intersecting each other, two ends of the first shaft rod being disposed on the support seat, while two ends of the second shaft rod being disposed on the carrier platform.

28. The automatic solar tracking adjustment/control apparatus of solar generation system as claimed in claim 5, wherein the pivotal rotational assembly includes a pivot seat, a first shaft rod and a second shaft rod, the first and second shaft rods passing through the pivot seat and intersecting each other, two ends of the first shaft rod being disposed on the support seat, while two ends of the second shaft rod being disposed on the carrier platform.

29. The automatic solar tracking adjustment/control apparatus of solar generation system as claimed in claim 6, wherein the pivotal rotational assembly includes a pivot seat, a first shaft rod and a second shaft rod, the first and second shaft rods passing through the pivot seat and intersecting each other, two ends of the first shaft rod being disposed on the support seat, while two ends of the second shaft rod being disposed on the carrier platform.

30. The automatic solar tracking adjustment/control apparatus of solar generation system as claimed in claim 7, wherein the pivotal rotational assembly includes a pivot seat, a first shaft rod and a second shaft rod, the first and second shaft rods passing through the pivot seat and intersecting each other, two ends of the first shaft rod being disposed on the support seat, while two ends of the second shaft rod being disposed on the carrier platform.

31. The automatic solar tracking adjustment/control apparatus of solar generation system as claimed in claim 25, wherein the two ends of the first shaft rod are pivotally connected to the support seat via bearings and the two ends of the second shaft rod are connected to the carrier platform via bearings.

32. The automatic solar tracking adjustment/control apparatus of solar generation system as claimed in claim 26, wherein the two ends of the first shaft rod are pivotally connected to the support seat via bearings and the two ends of the second shaft rod are connected to the carrier platform via bearings.

33. The automatic solar tracking adjustment/control apparatus of solar generation system as claimed in claim 27, wherein the two ends of the first shaft rod are pivotally connected to the support seat via bearings and the two ends of the second shaft rod are connected to the carrier platform via bearings.

34. The automatic solar tracking adjustment/control apparatus of solar generation system as claimed in claim 28, wherein the two ends of the first shaft rod are pivotally connected to the support seat via bearings and the two ends of the second shaft rod are connected to the carrier platform via bearings.

35. The automatic solar tracking adjustment/control apparatus of solar generation system as claimed in claim 29, wherein the two ends of the first shaft rod are pivotally connected to the support seat via bearings and the two ends of the second shaft rod are connected to the carrier platform via bearings.

36. The automatic solar tracking adjustment/control apparatus of solar generation system as claimed in claim 30, wherein the two ends of the first shaft rod are pivotally connected to the support seat via bearings and the two ends of the second shaft rod are connected to the carrier platform via bearings.

* * * * *